(12) United States Patent
Dybek et al.

(10) Patent No.: US 9,190,249 B2
(45) Date of Patent: Nov. 17, 2015

(54) HOLLOW CATHODE SYSTEM, DEVICE AND METHOD FOR THE PLASMA-ASSISTED TREATMENT OF SUBSTRATES

(71) Applicant: VON ARDENNE GMBH, Dresden (DE)

(72) Inventors: Konrad Dybek, Dresden (DE); Frank Stahr, Arnsdorf (DE); Klaus Schade, Moritzburg (DE)

(73) Assignee: VON ARDENNE GmbH, Dresden (DE)

( * ) Notice: Subject to any disclaimer, the term of this patent is extended or adjusted under 35 U.S.C. 154(b) by 0 days.

(21) Appl. No.: 14/514,445

(22) Filed: Oct. 15, 2014

(65) Prior Publication Data
US 2015/0104896 A1   Apr. 16, 2015

(30) Foreign Application Priority Data
Oct. 15, 2013 (DE) .......................... 10 2013 111 360

(51) Int. Cl.
| | |
|---|---|
| *H01L 21/00* | (2006.01) |
| *H01J 37/32* | (2006.01) |
| *H05H 1/46* | (2006.01) |
| *C23C 16/448* | (2006.01) |
| *C23C 16/50* | (2006.01) |

(Continued)

(52) U.S. Cl.
CPC ............. *H01J 37/32596* (2013.01); *C23C 8/36* (2013.01); *C23C 16/448* (2013.01); *C23C 16/50* (2013.01); *H01L 31/186* (2013.01); *H05H 1/46* (2013.01); *H01J 2237/327* (2013.01)

(58) Field of Classification Search
CPC ................................................ H01J 37/32596

USPC ............................................................. 438/57
See application file for complete search history.

(56) References Cited

U.S. PATENT DOCUMENTS 3,562,141 A * 2/1971 Morley .................... 204/298.05
3,728,861 A * 4/1973 Fletcher et al. ................. 60/202

(Continued)

FOREIGN PATENT DOCUMENTS

| DE | 19505268 A1 | 8/1996 |
|---|---|---|
| DE | 19635669 C1 | 7/1997 |

(Continued)

OTHER PUBLICATIONS

Leonhardt et al; "Vacuum in Research and Practice," 1995, 1, 17.
Takeuchi et al; Thin Solid Films 390 (2001) 217.
Niikura et al; Proc. 19th EUPVSEC, Paris 2004, 1637 and Thin Solid Films 457 (2004) 84.

*Primary Examiner* — Reema Patel
*Assistant Examiner* — Syed Gheyas
(74) *Attorney, Agent, or Firm* — Heslin Rothenberg Farley & Mesiti P.C.

(57) ABSTRACT

A hollow cathode system, a device and a method for the plasma-assisted treatment of substrates includes at least one hollow cathode, which can be connected to a power supply. The hollow cathode includes an electrically conducting main body with an opening which is bounded by ribs, follows a spiral or meandering path and allows a gas to pass through in a direction perpendicular to a surface of the main body. Connecting bridge elements are provided on the ribs. The bridge elements serve ensure mechanical stability of the hollow cathode and optimize potential distribution of the hollow cathode. With the hollow cathode system, high treatment rates are achieved for homogeneous treatment of substrates of a large surface area with high plasma stability.

18 Claims, 4 Drawing Sheets

Figure 4:
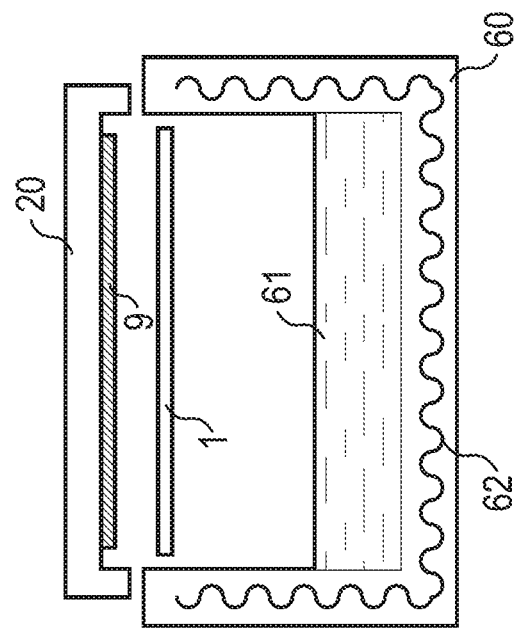

(51) Int. Cl.
*H01L 31/18* (2006.01)
*C23C 8/36* (2006.01)

(56) References Cited

U.S. PATENT DOCUMENTS

| | | | |
|---|---|---|---|
| 4,643,819 A | 2/1987 | Heroguelle | |
| 5,007,373 A | 4/1991 | Legg et al. | |
| 2001/0006093 A1* | 7/2001 | Tabuchi et al. | 156/345 |
| 2012/0258555 A1* | 10/2012 | Holland et al. | 438/5 |

FOREIGN PATENT DOCUMENTS

| | | |
|---|---|---|
| DE | 10060002 A1 | 7/2001 |
| DE | 10201992 A1 | 10/2002 |
| DE | 102010030608 B4 | 12/2011 |
| EP | 727508 A1 * | 8/1996 |
| RU | 2214476 C2 * | 10/2003 |

* cited by examiner

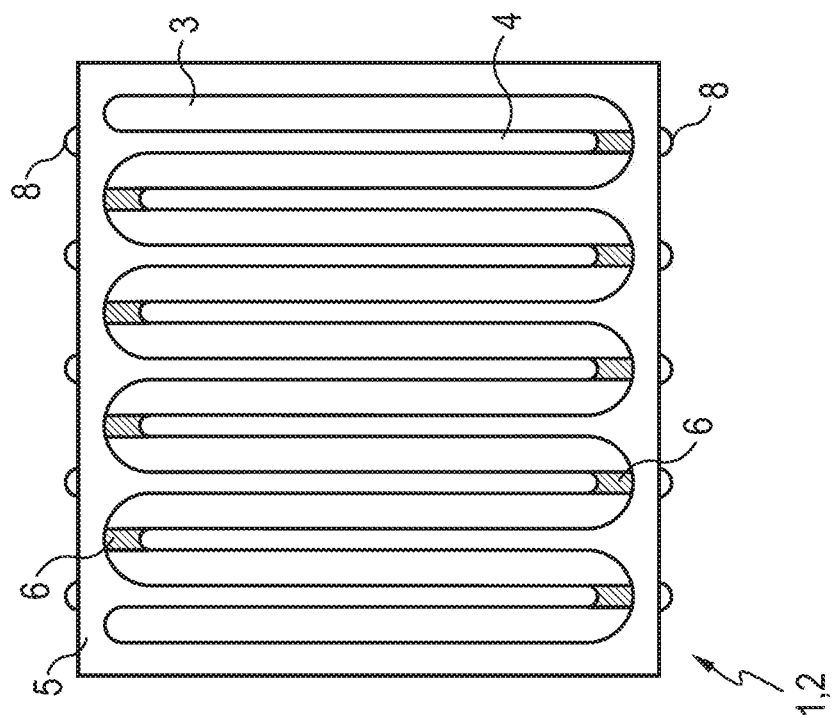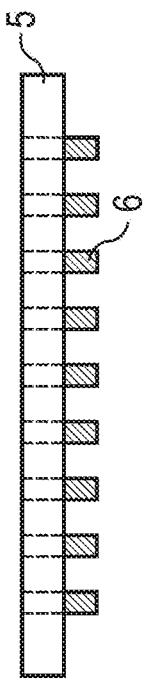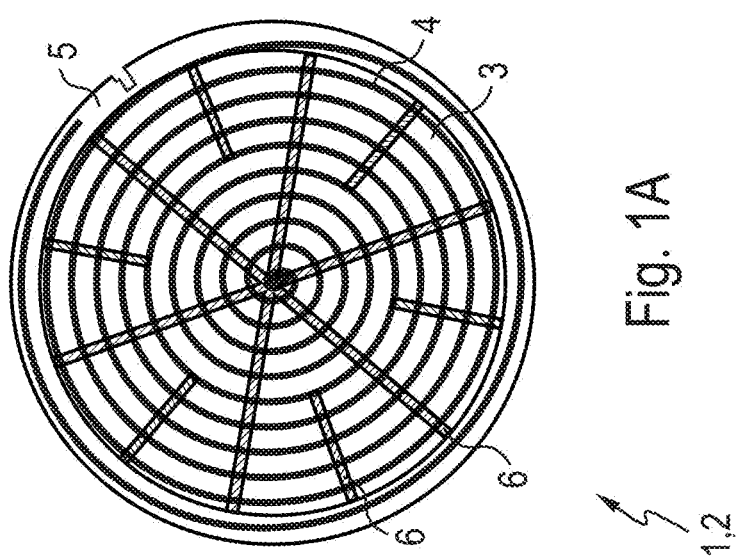

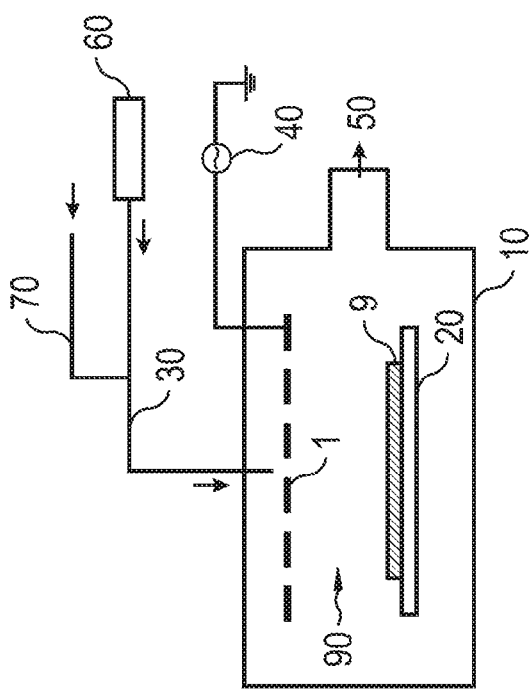
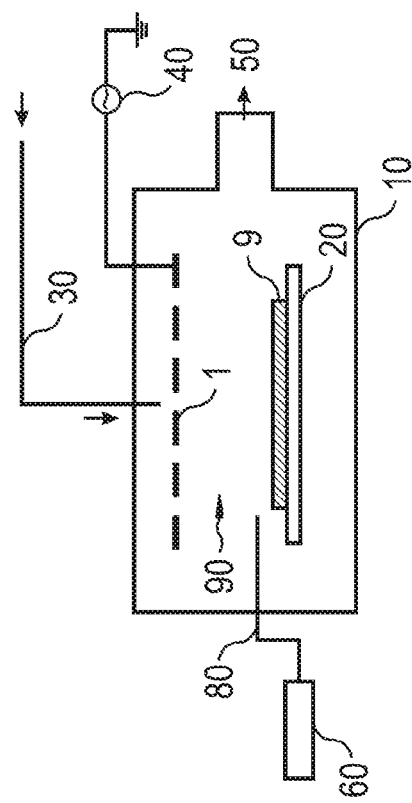

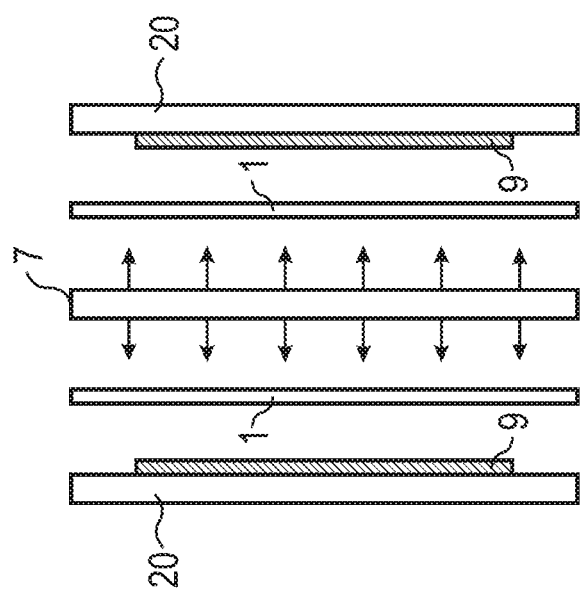

HOLLOW CATHODE SYSTEM, DEVICE AND METHOD FOR THE PLASMA-ASSISTED TREATMENT OF SUBSTRATES

CROSS REFERENCE TO RELATED APPLICATION

This application claims priority of German application No. DE 10 2013 111 360.5 filed on Oct. 15, 2013, the entire disclosure of which is hereby incorporated herein by reference.

BACKGROUND ART

The invention relates to a hollow cathode system, a device and a method for the plasma-assisted treatment of substrates, in particular a coating, a removal of substrate surfaces or an activation of the substrate surfaces for a subsequent treatment.

For the plasma-assisted deposition of thin films on substrates of a large surface area, usually large-area, plane-parallel electrode systems with electrode areas of a size corresponding approximately to that of the substrate area are used. However, these have the disadvantage that only low depositing rates can be achieved with them, and they are restricted with regard to the use of excitation frequencies in the very high-frequency range (VHF) by the generation of standing waves.

Customary methods for the activation of vapors with thermal cracking stages in vaporizers have decisive disadvantages: temperatures of 1200° C. and more are required for the generation of atomic Se from Se molecules evaporating from the evaporation material, which is desired for certain processes because of its relatively high reactivity.

Linear planar electrodes with areas of a width that is significantly less than their length, with or without being arranged in series, are described in DE 102 01 992 B4. The substrate is in this case generally located on a grounded substrate support, which is moved linearly, parallel to the width of the electrode. Also in such an arrangement, only low plasma densities are achieved, which leads to only low working speeds and consequently low productivity. Moreover, very small electrode spacings are necessary in such an arrangement for certain applications, typically lying below 10 mm. This leads to a high level of mechanical production complexity. Such an arrangement also often leads to a high current flow over the grounded substrate, the way in which the substrate contact is realized having a significant influence on the process of working the substrate.

In order to increase significantly the plasma density generated by a plasma source, hollow cathode arrangements are therefore used. A typical application area for this is the plasma-assisted working of surfaces. Gas discharges by means of hollow cathodes can be generated with DC voltage, with high-frequency pulsed DC voltage or else with high-frequency AC voltages. Leonhardt et al., Vakuum in Forschung and Praxis [vacuum in research and practice] 1995, 1, 17, gives here as a rule of thumb for the pressure p in dependence on the distance between the areas d forming the hollow cathodes: $p \times d = 1$ mbar cm. The greater the distance d, the lower therefore the pressure p at which the discharge ignites or working is performed.

Therefore, on account of the already many years of use and the very varied areas of use, there are a large number of configurations for hollow cathode arrangements, the most relevant of which for the invention are to be explained below.

Various hollow cathode systems with different electrode designs are described in DE 195 05 268 A1. They are characterized by separate, individual or in-series, linear hollow cathodes or an array of hollow cathodes surrounding the substrate or by a plane-parallel electrode system with a mesh-like partially transparent electrode. The feeding in of gas takes place in this case in a defined manner through regions of the hollow cathodes. Because of inhomogeneous igniting conditions, however, the range of operating parameters must be restricted here, which in turn is disadvantageous for an application.

Takeuchi et al., Thin Solid Films 390 (2001) 217, describes conductor electrodes with excitation frequencies of 60 to 80 MHz, which consist of an array of linear hollow cathodes. These are formed by a series arrangement of in each case two rod-like electrode elements. The feeding in of reaction gas takes place either through openings in the rod electrodes or through a gas showerhead, which is arranged on the side facing away from the substrate electrode, so that the conductor electrode lies between the substrate electrodes and the gas showerhead. Also disadvantageous in the case of this hollow cathode system are the plasma formation that is inhomogeneous for steady-state PECVD, with tolerances of the properties of the layers of over 10%, and also the complicated coupling in of power.

Multihole-array electrodes for PECVD of amorphous and multicrystalline silicon are described by Niikura et al., Proc. 19th EUPVSEC, Paris 2004, 1637, and Thin Solid Films 457 (2004) 84. These are electrodes with a gas showerhead that are coupled to the HF/VHF power supply, the gas outlet openings having been widened into hole-like hollow cathodes. However, the production of the electrodes in this case involves a high level of mechanical complexity.

DE 10 2010 030 608 B4 discloses a device for the plasma-assisted treatment of substrates with a hollow cathode, which is arranged on the electrode area facing the reaction space and is formed as an uninterrupted, grating- or meander-like channel in the electrode surface. In this case, a gas inlet system and a gas removal system are used, arranged as linear systems on the longitudinal sides of the hollow cathode electrodes. Consequently, both the supply of reaction gas and the discharge of residual gas take place by way of these linear systems, it being possible for the supply to be located on one longitudinal side of the electrodes and the discharge to be located on the other longitudinal side of the electrodes. In the case of this device it is disadvantageous that a feeding in of gas by means of cost-intensive gas distributor systems and gas inlet systems, possibly coupled with a relative movement between the gas inlet and the substrate, is required. The gas distribution requires an appreciable pressure difference between the gas inlet in the gas distributor and the reaction space with the substrate.

The object of the invention is therefore to develop a cathode, a device and a method for the plasma-assisted treatment of substrates of a large surface area with high treatment rates, in the case of which a homogeneous treatment of substrates of a large surface area can be achieved with high plasma stability over the entire electrode region, and an increase in the plasma density can be achieved by an excitation of the plasma with very high frequencies, and cost-intensive gas distributor systems can be avoided.

BRIEF SUMMARY OF THE INVENTION

According to the invention, a hollow cathode system with at least one hollow cathode, which can be connected to a power supply, is used for generating a plasma for the plasma-assisted treatment of substrates, wherein the hollow cathode consists of an electrically conducting main body that has an uninterrupted opening which is bounded by ribs and follows a spiral or meandering path. Said opening serves here for allowing a gas to pass through in a direction perpendicular to the surface of the main body.

In one configuration of the invention, the hollow cathode system includes at least two hollow cathodes, which respectively have said opening that follows a meandering path. In this case, the hollow cathodes are stacked in parallel one on top of the other in a turned orientation in relation to one another about an axis perpendicular to their surfaces, preferably turned by 90°.

The stacked hollow cathodes are preferably galvanically coupled to one another, i.e. there is an electrically conductive connection between them.

Alternatively, the stacked hollow cathodes are insulated from one another.

In order to ensure the mechanical stability of the large-area main body or of the hollow cathode, connecting bridge elements are attached to the ribs.

Either these bridge elements connect the ribs to one another or the ribs are mechanically connected to a frame that surrounds the opening.

The connection of the ribs to the frame creates a stability of the ribs, since they are then mechanically connected to the mechanically stable frame.

The bridge elements are preferably arranged on the surface of the main body, so that the opening that follows a spiral or meandering path is not interrupted by bridge elements. By means of the bridge elements, an opening with a constant opening width can be achieved. For example, bridge elements of a flat extent and various lengths may be applied to the surface of the main body.

The meandering opening may for example be bounded by ribs running parallel to one another and the outer frame of the main body.

In the case of an opening of a meandering form, each rib has an end that is connected to the frame of the main body or to the main body itself and a free end, which protrudes freely into the opening. Thus, according to the invention, this free end may likewise be connected to the main body or to the frame of the main body by means of the bridge elements. Consequently, such a rib can no longer oscillate freely in the opening, whereby its mechanical stability is increased. Normally in the case of such a meandering opening there are multiple ribs. It is in this case expedient that each rib is connected to the main body or to the frame of the main body by means of a bridge element.

In the case of an opening of a spiral form, there is actually only one rib, which is likewise spirally formed. Here, the arrangement of the bridge elements then actually does not take place between ribs but rather between parts of the ribs that are adjacent one another. The spiral opening may for example be bounded by the outer frame of the main body and the continuous spiral rib. The hollow cathode can be easily configured as an electrically conducting plate with a spiral or meandering opening.

In the case of an opening of a spiral form, it will only be possible to connect to the main body or the frame thereof by means of the bridge elements the part of the spiral rib that represents the outermost part of the rib, which lies on the outer side of the opening. The parts of the spiral rib lying further inward can be respectively connected to the adjacent part of the rib by means of the bridge elements. In this case it is also possible that the bridge elements all lie on a line running radially outward from the center. The connection of the outer parts of the rib to the main body has the effect that they are fixed with respect to the main body, whereas the connection of the rib parts to one another stiffens the rib spiral, and thereby increases the mechanical stability.

It is advantageous to produce the bridge elements from an electrically conductive material, preferably from the same material as the main body. Consequently, the bridge elements make it possible to homogenize the discharge over large areas, and consequently the working of the substrate.

The potential distribution on the hollow cathode is set by the ribs and by the arrangement of the conductive bridge elements. Consequently, an optimum potential distribution can be achieved by a suitable arrangement.

It is advantageous to produce the hollow cathode with the bridge elements, i.e. all the components of the hollow cathode (the main body with the ribs, the outer frame and the bridge elements), from a thermostatable material, so that the hollow cathode can be cooled or heated or kept at a desired temperature. The hollow cathode is preferably configured as a thermostatable tube.

For the coating of plate-like substrates, the main body may for example be of a planar configuration. Alternatively, the main body may be of a curved configuration for the coating of bent substrates. The main body may be of a circular or rectangular form. Thus, for example, a hollow cathode may be configured with a spiral-circular or a spiral-rectangular or a meandering-rectangular form of opening.

The hollow cathode or the main body preferably consists of a carbon material, for example graphite, for treatment processes at high temperatures, or preferably consists of high-grade steel in the case of low temperatures, or preferably consists of an aluminum alloy in the case of reactive processes.

The hollow cathode has one or more electrical connections for the coupling in of the power supply, so that single-point or multi-point power coupling can be realized on the hollow cathode. This feeding in of power at a number of points on the hollow cathode serves for homogenizing the potential distribution.

The way in which the opening is configured according to the invention is that a high plasma density is generated and good stability of the plasma formation is ensured. Plasma inhomogeneities, often caused in the prior art by individual regions of the hollow cathode failing to ignite, are largely ruled out here.

The device according to the invention for the plasma-assisted treatment of substrates is based on a treatment chamber in which there is at least one substrate holder for receiving a substrate, at least one supply line for feeding in a gas and/or a vaporous material and a hollow cathode system with at least one hollow cathode.

The power supply to the hollow cathode may optionally be ensured by the feeding in of a DC voltage, low-frequency (LF), high-frequency (HF) or ultrashortwave (VHF) AC voltage or pulsed DC voltage. The power coupling between the hollow cathode and the power supply takes place with or without impedance matching.

The hollow cathode used here allows high plasma densities to be generated; at the same time, large substrate areas can be covered, and there is only low bombardment of the substrate with high-energy particles, and consequently low thermal loading.

The device according to the invention is suitable in particular for highly productive use in the deposition of coatings on thin-film solar cells from amorphous or microcrystalline silicon, Si compounds and alloys or in the chalcogeniding of thin-film solar cells on the basis of Cu, Ga, In and Se/S. This device can also be used for a plasma activation of gases for nitriding, etching, or ashing or for a functionalization of polymer surfaces.

When using a hollow cathode lying in the proximity of the substrate, the bridge elements are preferably arranged on the surface of the main body that is facing away from the substrate to be treated or the substrate holder.

Alternatively, when using a hollow cathode that is located in the proximity of a vaporizer and away from the substrate, the bridge elements are arranged on the surface of the main body that is facing away from the vaporizer. Here the vaporizer serves for generating a vaporous material for the coating of a substrate. In this variant, the vaporizer may act as a counter electrode.

In one configuration of the invention, the feeding in of gas into the treatment chamber takes place through the hollow cathode or the opening, which has a negligible flow resistance. In this case, the hollow cathode leads to a homogeneous gas distribution over a large surface area and is formed as a gas distributor of a flat extent. This allows cost-intensive gas distributor systems in the proximity of the electrode to be avoided, in particular in the case of gas being let in through large-area electrodes or in the case of lateral gas inlet systems for linear electrodes.

In the case of another configuration of the invention, the hollow cathode is formed as a gas distributor for the feeding in of an inert gas. Furthermore, a second supply line for the feeding in of a reactive gas and/or a vaporous material is arranged in the direct proximity of the substrate, between the substrate holder and the hollow cathode. Consequently, a reaction of the hollow cathode with the reactive gas or the vaporous material can be reduced. This makes a treatment process that is stable over a long time possible.

Depending on the opening width of the hollow cathode d, the distance between the substrate electrode and the hollow cathode electrode D and the pressure conditions p in the treatment chamber, the hollow cathode leads to a hollow cathode plasma, for example a plasma generated by means of a hollow cathode glow discharge, to a capacitively coupled plasma, for example a plasma generated by means of a plane-parallel electrode system, or to a hybrid form of the two.

The device according to the invention can ensure a plasma formation that is virtually uninfluenced by the distance between the substrate and the hollow cathode electrode, by the distance of the chamber wall from the electrode, by the substrate material and by the substrate grounding. When this device is used, treatment of the substrate in a wide pressure range is likewise possible.

On account of the little influence of the substrate potential, the hollow cathode can be used for applications with a great distance from the hollow cathode to the substrate. With preference, the distance between the subject holder and hollow cathode lies in the range from 100 to 200 mm and is not dependent on the plasma formation. The plasma may be generated by means of the hollow cathode at low to relatively high pressures, with preference in the range from $p \times d = 10$ Pa cm to 1300 Pa cm, where p is the pressure and d is the opening width.

The substrate holder may be connected to a transporting device, so that the substrate moves in the treatment chamber. The hollow cathode may be operated in stationary or dynamic manner with a moving substrate.

With the substrate and the substrate holder may be arranged parallel to one another vertically or horizontally in the treatment chamber. In the case of a horizontal arrangement, the hollow cathode may be arranged above or below the substrate holder.

In one configuration of the invention, two substrate holders are provided in the treatment chamber, arranged on opposite sides of the hollow cathode. The substrate surfaces to be treated are facing the hollow cathode.

In another configuration of the invention, multiple hollow cathodes are arranged in the treatment chamber for the simultaneous treatment of multiple substrates. For example, hollow cathodes and substrate holders may be arranged in the treatment chamber parallel to one another with the substrate surfaces to be treated facing the hollow cathodes. This can increase the productivity significantly.

In a further configuration of the invention, a vaporizer is provided for vaporizing a material and the hollow cathode is formed as part of the vaporizer.

In the case of the method according to the invention for the plasma-assisted treatment of a substrate, a hollow cathode system with at least one hollow cathode is used in a treatment chamber, wherein at least one gas or vapor is fed into a reaction space of the treatment chamber and wherein a plasma is generated by means of a gas discharge in an opening that follows a spiral or meandering path of the hollow cathode connected to a power supply and wherein the gas or the vapor is at least partially passed through the hollow cathode.

The power from the power supply, for example from an HF power supply, is fed into the hollow cathode at a number of points with a defined phase shift.

In one configuration of the invention, a vapor stream is generated from a material by means of a vaporizer and is activated in the reaction space by the action of a low-pressure gas discharge or by a plasma generated in the low-pressure gas discharge. The plasma activation of the vapor stream may take place at process temperatures of up to over 800° C.

The vapor stream may be fed into the reaction space through the opening of the hollow cathode. In this case, a defined temperature profile from the vaporizer to the hollow cathode may be set.

Alternatively, an inert gas may be fed through the hollow cathode into the reaction space and a reactive gas and/or the vapor stream may be added in the direct proximity of the substrate.

It is possible that the substrate is subjected to an additional DC voltage, which has a lower frequency in comparison with the frequency of the power supply of the hollow cathode.

In the case of the method according to the invention, multiple substrates may be simultaneously subjected to an inert gas and an addition of reactive gas or a vapor stream by means of multiple hollow cathodes.

BRIEF DESCRIPTION OF THE DRAWING FIGURES

Figure 3:
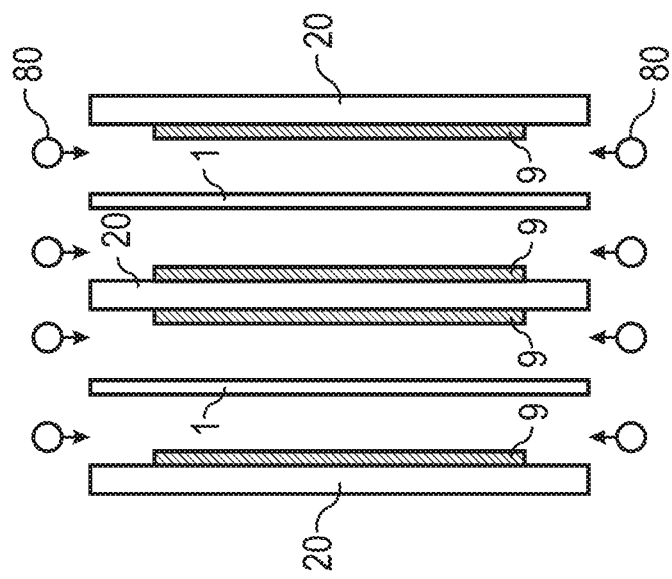

The invention is explained in more detail below on the basis of exemplary embodiments and associated drawings, in which:

FIGS. 1A and 1B show a plan view of a hollow cathode with a spiral (FIG. 1A) or meandering (FIG. 1B) opening, FIG. 1C shows a side view of a hollow cathode according to FIG. 1B, FIGS. 2A and 2B show a device according to the invention for the coating of a substrate, FIG. 3 shows an arrangement of multiple hollow cathodes and substrate holders, FIG. 4 shows an arrangement of a hollow cathode with a vaporizer, and FIG. 5 shows an arrangement of hollow cathodes and substrate holders with a gas distributor.

DETAILED DESCRIPTION

In FIG. 1A, a circular hollow cathode with a spiral opening is represented. The hollow cathode 1 consists of a planar electrically conducting main body 2, for example a circular plate 2 of graphite or high-grade steel. In the plate 2 there is an opening 3 that follows a spiral path. The opening 3 is bounded by a spiral rib 4 and an outer frame 5. On the rear side of the plate 2 there are rods 6, which serve as bridge elements to ensure the mechanical stability of the plate 2. Here, the opening 3 serves for allowing through a gas, which is transported in a perpendicular direction in relation to the plane of the plate 2, and may be referred to as a channel.

In FIG. 1B, a rectangular hollow cathode with a meandering opening is represented. The hollow cathode 1 consists for example of a rectangular plate 2 with an opening 3 that follows a meandering path. The opening 3 is bounded by ribs 4 running parallel to one another and an outer frame 5. On the rear side of the plate 2 there are bridge elements 6. FIG. 1C shows the side view of the hollow cathode represented in FIG. 1B The bridge elements 6 may be produced for example from the same material as the hollow cathode 3. FIG. 1B shows a simple arrangement of the bridge elements 6 of the hollow cathode 1. Depending on desired potential distributions at the hollow cathode, the arrangement of the bridge elements on the hollow cathode is variable. On the outer frame 5 of the plate 2 there are multiple electrical connections 8, which serve for the coupling of a power supply that is not represented to the hollow cathode.

In FIG. 2A, a device for the plasma-assisted deposition of coatings on substrates is represented. In a vacuum chamber 10 there are a substrate 9 on a substrate holder 20, a supply line 30 for feeding in a gas and a hollow cathode 1 lying opposite the substrate holder 20. The hollow cathode 1 is for example connected to an HF power supply 40. The hollow cathode 1 may alternatively be connected to the HF power supply 40 by way of an impedance matching that is not represented. The vacuum chamber 10 is connected to a pumping system 50.

For example when producing CIGSe solar cells, i.e. Cu—In—Ga—Se solar cells, a coated substrate 9 with a Cu—In—Ga layer stack is introduced into the vacuum chamber 10. A vaporizer 60 for selenium is connected to the supply line 30. The supply line 30 is also connected to a second supply line 70 for feeding in argon. The stream of selenium vapor with argon is then fed through the hollow cathode 1 into the vacuum chamber 10. The transporting path of the vapor stream, i.e. from the vaporizer 60 to the hollow cathode 1, is heated. Thus, for example, the vaporizer 60, the supply line 30 and the hollow cathode 1 are respectively connected to a heater that is not represented. When a voltage is applied to the hollow cathode 1, the vapor stream is activated by the action of a plasma and, in the activated form, is made to react with the Cu—In—Ga layer stack. This produces a Cu—In—Ga—Se layer stack on the substrate 9.

FIG. 2B shows a second device for producing CIGSe solar cells. As a difference from FIG. 2A, only an inert gas, argon, is fed into the vacuum chamber 10 by way of the supply line 30. The vaporizer 60 is connected to a second supply line 80, which is located in the direct proximity of the substrate. The plasma is generated by means of a hollow cathode glow discharge in the vacuum chamber 10. The vapor stream fed in in the proximity of the substrate is then activated by the plasma and, in the activated form, is made to react with the Cu—In—Ga layer stack.

FIG. 3 shows an arrangement of multiple hollow cathodes for the treatment of multiple substrates. Two hollow cathodes 1 and three substrate holders 20 are arranged vertically in parallel with one another. On both sides of the middle substrate holder 20 there is in each case a substrate 9. A reactive gas or a vapor stream is fed into the reaction space by way of the supply line 80 in the proximity of the substrate. In this way the productivity or the treatment rate can be increased.

FIG. 4 shows a vaporizer with a hollow cathode. The vaporizer 60 consists of a crucible with a heater 62 for heating the crucible. A vapor stream of a evaporation material 61, for example selenium, is generated by means of the vaporizer 60. The hollow cathode 1 is arranged directly in the proximity of the vaporizer 60 and is provided as part of the vaporizer 60. Opposite the hollow cathode 1 there is a substrate 9 on a substrate holder 20. The hollow cathode 1 forms the connection of a line from the vaporizer 60 to the reaction space. The vapor stream of selenium is activated by a low-pressure gas discharge or a plasma and is made to react with the surface of the substrate 9 in the reaction space.

FIG. 5 shows an arrangement of hollow cathodes, substrate holders and an additional gas distributor. Two hollow cathodes 1, a gas distributor 7 of a flat extent and two substrate holders 20 are arranged vertically in parallel with one another. The substrates 9 are respectively fastened on the side of the substrate holders 20 that is facing the hollow cathode 1. The gas distributor 7 is arranged between two hollow cathodes 1. In this case, a reactive gas or a vapor stream is fed into the reaction space by way of the gas distributor 7.

The invention claimed is:

1. A hollow cathode system for generating a plasma for plasma-assisted treatment of substrates with at least one hollow cathode adapted to be connected to a power supply, wherein the at least one hollow cathode comprises an electrically conducting main body having an uninterrupted opening extending fully through the main body, bounded along sides by ribs, following a spiral or meandering path and allowing a gas to pass through in a direction perpendicular to an outer surface of the main body wherein bridge elements connecting the ribs are provided on the outer surface of the main body.

2. The hollow cathode system as claimed in claim 1, including at least two said hollow cathodes with an uninterrupted opening that follows a meandering path, stacked in parallel one on top of the other in a turned orientation relative to one another about an axis perpendicular to the outer surface of the main body.

3. The hollow cathode system as claimed in claim 2, wherein the stacked hollow cathodes are galvanically coupled to one another.

4. The hollow cathode system as claimed in claim 2, wherein the stacked hollow cathodes are insulated from one another.

5. The hollow cathode system as claimed in claim 1, wherein the bridge elements comprise an electrically conductive material.

6. The hollow cathode system as claimed in claim 1, wherein potential distribution at the at least one hollow cathode is set by the bridge elements.

7. The hollow cathode system as claimed in claim 1, wherein the at least one hollow cathode can be heated or cooled by the bridge elements and is configured as a thermostatable tube.

8. The hollow cathode system as claimed in claim 1, wherein the at least one hollow cathode has one or more electrical connections for coupling in of the power supply.

9. A device for the plasma-assisted treatment of substrates with at least one treatment chamber, a substrate holder for receiving a substrate, a supply line for feeding in a gas and a hollow cathode system with at least one hollow cathode adapted to be connected to a power supply, wherein the at least one hollow cathode comprises an electrically conducting main body having an uninterrupted opening extending fully through the main body, bounded along sides by ribs, following a spiral or meandering path and allowing a gas to pass through in a direction perpendicular to an outer surface of the main body, further including a vaporizer for generating a vapor stream of vaporous material, and wherein the at least one hollow cathode comprises part of the vaporizer and is positioned to intersect the vapor stream such that the vaporous material passes through the uninterrupted opening towards the substrate holder.

10. The device as claimed in claim 9, wherein the at least one hollow cathode is provided with bridge elements arranged on the outer surface of the main body facing away from the substrate holder.

11. The device as claimed in claim 9, wherein the at least one hollow cathode is provided with bridge elements arranged on the outer surface of the main body facing away from the vaporizer.

12. The device as claimed in claim 9, wherein the hollow cathode is formed as a gas distributor for the feeding in of an inert gas and a second supply line for the feeding in of a reactive gas and/or a vaporous material is arranged in direct proximity of the substrate, between the substrate holder and the at least one hollow cathode.

13. The device as claimed in claim 9, wherein multiple hollow cathodes are arranged in the treatment chamber for simultaneous treatment of multiple substrates.

14. A method for plasma-assisted treatment of a substrate in a reaction space of a treatment chamber, into which at least one gas is fed, wherein a gas discharge is generated in the uninterrupted opening that follows a spiral or meandering path of the at least one hollow cathode connected to a power supply of the hollow cathode system as claimed in claim 1, wherein the at least one gas is at least partially passed through the at least one hollow cathode.

15. The method as claimed in claim 14, wherein a vapor stream is generated from a material by a vaporizer and is fed into the reaction space through the at least one hollow cathode, and a defined temperature profile from the vaporizer to the at least one hollow cathode is set.

16. The method as claimed in claim 14, wherein an inert gas is fed into the reaction space through the at least one hollow cathode and a reactive gas or a vapor stream is added in direct proximity of the substrate.

17. The hollow cathode system as claimed in claim 1, wherein the main body has one of: a planar configuration for treating a planar substrate or a curved configuration for treating a bent substrate.

18. The device as claimed in claim 9, wherein the main body has one of: a planar configuration for treating a planar substrate or a curved configuration for treating a bent substrate.

* * * * *